United States Patent
Hayakawa et al.

(10) Patent No.: US 9,762,030 B2
(45) Date of Patent: Sep. 12, 2017

(54) METHOD OF MANUFACTURING SURFACE-EMITTING SEMICONDUCTOR LASER ELEMENT

(71) Applicant: FUJI XEROX CO., LTD., Tokyo (JP)

(72) Inventors: Junichiro Hayakawa, Kanagawa (JP); Akemi Murakami, Kanagawa (JP); Takashi Kondo, Kanagawa (JP); Naoki Jogan, Kanagawa (JP); Jun Sakurai, Kanagawa (JP)

(73) Assignee: FUJI XEROX CO., LTD., Tokyo (JP)

( * ) Notice: Subject to any disclaimer, the term of this patent is extended or adjusted under 35 U.S.C. 154(b) by 0 days.

(21) Appl. No.: 15/225,048

(22) Filed: Aug. 1, 2016

(65) Prior Publication Data

US 2017/0070033 A1    Mar. 9, 2017

(30) Foreign Application Priority Data

Sep. 9, 2015 (JP) .................................. 2015-177188

(51) Int. Cl.
   *H01S 5/183* (2006.01)
   *H01S 5/042* (2006.01)
   (Continued)

(52) U.S. Cl.
   CPC ......... *H01S 5/18311* (2013.01); *H01S 5/0425* (2013.01); *H01S 5/2081* (2013.01);
   (Continued)

(58) Field of Classification Search
   CPC ............... H01S 5/18311; H01S 5/0425; H01S 2301/176; H01S 5/34313; H01S 2301/173;
   (Continued)

(56) References Cited

U.S. PATENT DOCUMENTS 8,027,370 B2    9/2011  Masui et al.
2006/0222028 A1*  10/2006  Hatori .................... B82Y 10/00
                                              372/45.01
(Continued)

FOREIGN PATENT DOCUMENTS

JP    2007-173513 A    7/2007
JP    2010-182973 A    8/2010

OTHER PUBLICATIONS

Lin et al. ("Pattern-Coverage Effect on Light Extraction Efficiency of GaN LED on Patterned-Sapphire Substrate," Electrochemical and Solid-State Letters, 15 (3) H72-H74, 2012).*

(Continued)

*Primary Examiner* — Yasser A Abdelaziez
(74) *Attorney, Agent, or Firm* — Sughrue Mion, PLLC

(57) ABSTRACT

Provided is a method of manufacturing a surface-emitting semiconductor laser element including a first process of forming, on a substrate, a semiconductor layer that includes a first semiconductor multilayer reflection mirror, a rough surface formation layer, an active region, a second semiconductor multilayer reflection mirror, and a current confining layer, a second process of forming a mesa structure of the semiconductor layer by etching the semiconductor layer until the rough surface formation layer is exposed, a third process of oxidizing a region including the current confining layer and the rough surface formation layer exposed to the circumference of the mesa structure, a fourth process of forming a rough surface region by performing an acid treatment on a region including the oxidized rough surface formation layer, and a fifth process of forming an insulating film on the region including the rough surface region.

20 Claims, 9 Drawing Sheets

(51) Int. Cl.
 *H01S 5/20* (2006.01)
 *H01S 5/343* (2006.01)
(52) U.S. Cl.
 CPC ..... *H01S 5/34313* (2013.01); *H01S 2301/173* (2013.01); *H01S 2301/176* (2013.01)
(58) Field of Classification Search
 CPC .... H01S 5/2081; H01S 5/18308; H01S 5/042; H01S 5/343; H01S 5/2054; H01S 2301/17
 See application file for complete search history.

(56) References Cited

U.S. PATENT DOCUMENTS

| | | | |
|---|---|---|---|
| 2010/0029027 A1* | 2/2010 | Ikuta | H01S 5/18391 438/29 |
| 2012/0008659 A1* | 1/2012 | Kawakita | H01S 5/18311 372/45.01 |
| 2015/0099317 A1* | 4/2015 | Hayakawa | H01S 5/02476 438/27 |

OTHER PUBLICATIONS

Robadey et al. ("Gain coupled DFB lasers with active layer grwon on a corrugated substrate by moleculaer beam epitaxy," El.ectronic Letterm vol. 33, No. 4, pp. 297-298, Feb. 1997).*

* cited by examiner

BEFORE ACID TREATMENT

BHF TREATMENT FOR 60 SECONDS

BHF TREATMENT FOR 180 SECONDS

US 9,762,030 B2

METHOD OF MANUFACTURING SURFACE-EMITTING SEMICONDUCTOR LASER ELEMENT

CROSS-REFERENCE TO RELATED APPLICATIONS

This application is based on and claims priority under 35 USC 119 from Japanese Patent Application No. 2015-177188 filed Sep 9, 2015.

BACKGROUND

Technical Field

The present invention relates to a method of manufacturing a surface-emitting semiconductor laser element.

SUMMARY

According to an aspect of the invention, there is provided a method of manufacturing a surface-emitting semiconductor laser element including:

a first process of forming, on a substrate, a semiconductor layer that includes a first semiconductor multilayer reflection mirror of a first conductivity type, a rough surface formation layer on the first semiconductor multilayer reflection mirror, an active region on the rough surface formation layer, a second semiconductor multilayer reflection mirror of a second conductivity type on the active region, and a current confining layer that is adjacent to the active region;

a second process of forming a mesa structure of the semiconductor layer by etching the semiconductor layer until the rough surface formation layer is exposed;

a third process of oxidizing a region including the current confining layer and the rough surface formation layer exposed to the circumference of the mesa structure;

a fourth process of forming a rough surface region by performing an acid treatment on a region including the oxidized rough surface formation layer; and a fifth process of forming an insulating film on the region including the rough surface region.

BRIEF DESCRIPTION OF THE DRAWINGS

Exemplary embodiments of the present invention will be described in detail based on the following figures, wherein.

DETAILED DESCRIPTION

Hereinafter, detailed description will be given of an exemplary embodiment to perform the invention with reference to the drawings.

Figure 1:
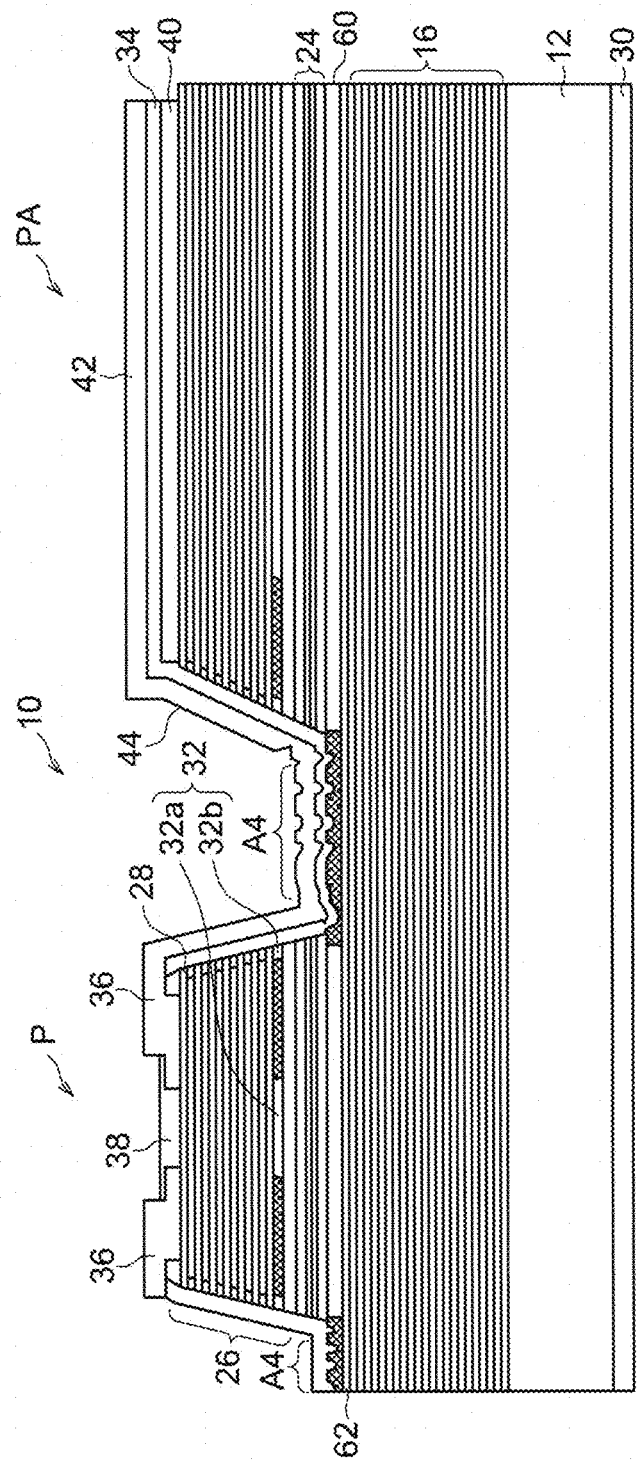
FIG. 1 is a vertical sectional view illustrating an example of a configuration of a surface-emitting semiconductor laser element according to an exemplary embodiment.

FIG. 1 is a vertical sectional view illustrating an example of a configuration of a surface-emitting semiconductor laser (VCSEL: vertical cavity surface emitting laser) element 10 according to the exemplary embodiment. Although a GaAs-based surface-emitting semiconductor laser element using an n-type GaAs substrate will be exemplified in the exemplary embodiment, the exemplary embodiment is not limited thereto and may be applied to a surface-emitting semiconductor laser element using an InGaAsP-based material, an AlGaInP-based material, an InGaN/GaN-based material, or the like. The substrate is not limited an n-type substrate, and a p-type substrate may be used. In such a case, it is only necessary to replace the n-type in the following description with the p-type.

As illustrated in FIG. 1, a VCSEL element 10 according to the exemplary embodiment includes a post (mesa) P, a pad formation region PA, and a rough surface region A4. The post P is a light emitting portion formed into a mesa shape, and the pad formation region PA is a region for forming electrode pad 42. The rough surface region A4 is a region including irregularity formed on the surface of a rough surface formation layer 60 and is a main layer for enhancing humidity resistance in the VCSEL element 10. Detailed description will be given below of the rough surface region A4.

As illustrated in FIG. 1, the post P and the pad formation region PA of the VCSEL element 10 has the respective semiconductor layers that are commonly formed. That is, the VCSEL element 10 includes a lower distributed bragg reflector (DBR) 16, an oxidation stopping layer 62, the rough surface formation layer 60, an active region 24, an oxidation confining layer (current confining layer) 32, an upper DBR 26, and a P-type GaAs contact layer 28 that are form on the n-type GaAs substrate 12. A resonator is formed by an interface between the lower DBR 16 and the active region 24 and an interface between the upper DBR 26 and the active region 24. An n-type GaAs buffer layer is provided between the substrate 12 and the lower DBR 16 in some cases. The buffer layer is a layer provided for obtaining satisfactory crystallinity for the surface of the substrate after thermal cleaning.

An interlayer insulating film 34 as an insulating film is deposited at the circumference of the semiconductor layer including the mesa structure, and a P-type electrode 36 is provided via the interlayer insulating film 34. The P-type electrode 36 is connected to the P-type GaAs contact layer 28 and forms ohmic contact with the contact layer 28. In addition, the P-type electrode 36 is connected to the electrode pad 42 via an electrode wiring 44. The interlayer insulating film 34 is formed of a silicon oxynitride film (SiON) or a silicon nitride (SiN) film, for example. The P-type electrode 36 is formed by depositing a Ti (titanium)/ Au (gold) laminated film, for example.

In contrast, an n-type electrode 30 is provided on a surface opposite to a surface, on which the semiconductor layer is formed, of the substrate 12. The n-type electrode 30 is formed by depositing an AuGe (alloy of gold and germanium)/Au laminated film in one example.

A mask 40 remains between the contact layer 28 and the interlayer insulating film 34 in the pad formation region PA. The mask 40 is a layer provided to form the post P in the method of manufacturing the VCSEL element 10, which will be described later, and is formed of a SiN film, for example. Furthermore, an emitting protection film 38 for protecting a light emitting surface is provided on the contact layer 28.

As the n-type GaAs substrate 12 according to the exemplary embodiment, an Si (silicon)-doped GaAs substrate is used in one example.

The n-type lower DBR 16 formed on the substrate 12 is a multilayer reflection mirror formed by alternately and repeatedly laminating two semiconductor layers with a film thickness of $0.25\lambda'/n$ and mutually different refraction indexes where $\lambda'$ represents an oscillation wavelength of the VCSEL element 10 and n represents a refraction index of a medium (semiconductor layers). In the surface-emitting semiconductor laser element 10 according to the exemplary embodiment, the oscillation wavelength $\lambda'$ is set to 780 nm in one example. In the exemplary embodiment, the refraction index n of the semiconductor layer is set to 3.07, and the wavelength $\lambda$ in the medium is set to $\lambda'/n=254$ nm.

The oxidation stopping layer 62 and the rough surface formation layer 60 are formed on the lower DBR 16 in this order. The rough surface formation layer 60 is a layer including the rough surface region A4 formed by an oxidation treatment of the method of manufacturing the VCSEL element according to the exemplary embodiment, which will be described later, and an acid treatment. The rough surface region A4 formed in the rough surface formation layer 60 enhances a degree of adhesion to the interlayer insulating film 34 formed on the rough surface formation layer 60. The rough surface formation layer 60 contains $Al_{0.9}Ga_{0.1}As$ in one example, and the film thickness is set to 191 nm ($3\lambda/4$) in one example.

The oxidation stopping layer 62 is a layer for stopping oxidation of the rough surface formation layer 60 in the aforementioned oxidation processing. The oxidation stopping layer 62 contains a material that is hardly oxidized than the rough surface formation layer 60, such as $Al_{0.3}Ga_{0.7}As$, and the film thickness is set to 64 nm ($\lambda/4$) in one example.

The rough surface formation layer 60 and the oxidation stopping layer 62 according to the exemplary embodiment are formed as apart of the lower DBR 16 such that each film thickness (or the total film thickness thereof) is an integer multiple of $\lambda/4$. However, the thicknesses are not limited thereto, and for example, the rough surface formation layer 60 and the oxidation stopping layer 62 maybe formed as apart of the lower spacer layer such that the film thickness of the rough surface formation layer 60 is set to 254 nm ($\lambda$) and the film thickness of the oxidation stopping layer 62 is set to 127 nm ($\lambda/2$).

The active region 24 according to the exemplary embodiment is formed by laminating the lower spacer layer, a quantum well active layer, and an upper spacer layer in this order from the side of the substrate 12. The quantum well active layer according to the exemplary embodiment is formed of four barrier layers made of $Al_{0.3}Ga_{0.7}As$ and three quantum well layers made of $A_{0.11}Ga_{0.89}As$ provided therebetween. The lower spacer layer and the upper spacer layer have a function of adjusting the length of the resonator and also have a function as a clad layer for trapping carriers by being arranged between the quantum well active layer and the lower DBR 16 and between the quantum well active layer and the upper DBR 26, respectively.

The oxidation confining layer 32 provided on the active region 24 includes a current injection region 32a and a selectively oxidized region 32b. A current flowing from the p-type electrode 36 toward the n-type electrode 30 is confined by the current injection region 32a.

The upper DBR 26 formed on the oxidation confining layer 32 is a multilayer reflection mirror formed by alternately and repeatedly laminating two semiconductor layers with a film thickness of $0.25\lambda$ and mutually different refraction indexes.

Incidentally, the VCSEL element as described above is used as a light source for optical communication or a light source for electronic devices such as a power source for writing in an electrophotography system since it is possible to extract a laser output in a direction orthogonal to the substrate and to easily form an array by two-dimensional integration.

The VCSEL element includes a pair of distribution bragg reflector (the lower DBR 16 and the upper DBR 26) provided on the semiconductor substrate (the n-type GaAs substrate 12), an active layer (quantum well active layer) provided between the pair of distribution bragg reflectors, and a resonator spacer layer (the lower spacer layer and the upper spacer layer). The electrodes (the p-type electrode 36 and the n-type electrode 30) provided on both sides of the distribution bragg reflector injects a current to the active layer, causes laser oscillation orthogonal to the substrate surface, and emits the oscillated light via the emitting protection film 38.

In order to enhance current injection efficiency, an AlGaAs layer with a high Al composition (AlAs or $Al_{0.98}Ga_{0.02}As$ as an example) is arranged in the vicinity of the active layer, high-temperature steam oxidation is performed on the AlGaAs layer, and the oxidation confining layer (oxidation confining layer 32) is thus formed in some cases. The oxidation confining layer is formed by forming the post P by etching the semiconductor layer after the epitaxial growth (hereinafter, referred to as "epitaxial growth" in some cases) into a mesa shape and intentionally performing an oxidation treatment on the side surface of the post P.

It is important for a typical semiconductor element to secure long-term reliability, and in particular, it is necessary to pay attention to protect the semiconductor element from external moisture and humidity. In relation to the VCSEL element, a configuration in which the exposed surfaces of the mesa side surface and the like are covered with an insulating film to prevent the exposed surfaces from being exposed to external moisture, humidity, and the like is known. However, since adhesiveness between the insulating film and the semiconductor layer is limited if the insulating film is simply formed on the semiconductor layer, there is a concern that defects due to peeling of the insulating film or disconnection of the electrode wiring occur when the VCSEL element is exposed to a high-temperature and high-humidity environment for a long period of time. Therefore, there is a room for improvement in the method of manufacturing the VCSEL element in terms of reliability in the high-temperature and high-humidity environment.

Thus, according to the exemplary embodiment, the rough surface formation layer is provided in the semiconductor layer (on the lower DBR), the rough surface formation layer is exposed from the circumference of the mesa, the exposed rough surface formation layer is subjected to an oxidation treatment and an acid treatment, and a rough surface (irregularity) in an order of submicron is thus formed. Since forming the interlayer insulating film on the rough surface formation layer including the rough surface increases a contact area between the rough surface formation layer and the interlayer insulating film, the adhesiveness between the rough surface formation layer and the interlayer insulating film is enhanced, and high humidity resistance is maintained.

Next, description will be given of an example of a method of manufacturing the surface-emitting semiconductor laser element 10 according to the exemplary embodiment with reference to FIGS. 2A to 5B.

Figure 2A:
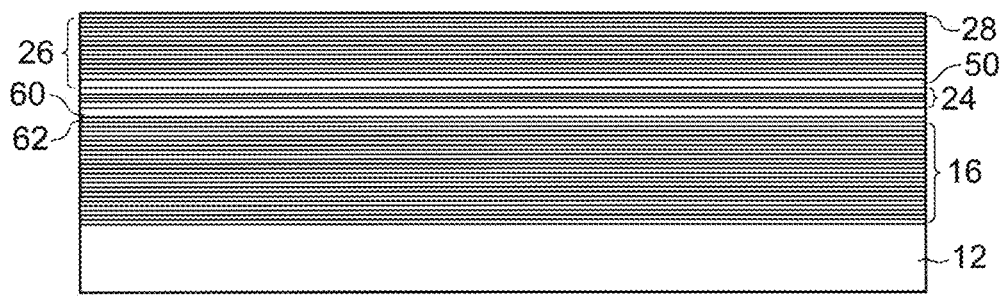
FIGS. 2A to 2C are partial vertical sectional views illustrating an example of a method of manufacturing the surface-emitting semiconductor laser element according to the exemplary embodiment.

First, an epitaxial wafer obtained by causing crystal growth (epitaxial growth) of the lower DBR 16, the oxidation stopping layer 62, the rough surface formation layer 60, the active region 24, an AlAs layer 50, the upper DBR 26, and the contact layer 28 on the substrate 12 in this order as illustrated in FIG. 2A is prepared. Description will be given below of a method of manufacturing the epitaxial wafer.

First, the n-type lower DBR 16 is formed on the n-type GaAs substrate 12 by alternately laminating, in 40 to 50 cycles, an $Al_{0.3}Ga_{0.7}As$ layer and an $Al_{0.9}Ga_{0.1}As$ layer with a film thickness of ¼ of the wavelength λ in the medium as illustrated in FIG. 2A. At this time, the carrier concentration of the $Al_{0.3}Ga_{0.7}As$ layer and the carrier concentration of the $Al_{0.9}Ga_{0.1}As$ layer are set to about $2\times10^{18}$ cm$^{-3}$, and the total film thickness of the lower DBR 16 is set to about 4 μm. The n-type carrier is Si in one example. There is also a case in which a buffer layer is provided between the substrate 12 and the lower DBR 16 as needed. In a case of forming the buffer layer, n-type GaAs with carrier concentration of about $2\times10^{18}$ cm$^{-3}$ and a film thickness of about 500 nm is laminated on the substrate 12 by an organic metal vapor phase growth (MOCVD) method or the like in one example.

Next, the oxidation stopping layer 62 and the rough surface formation layer 60 are laminated in this order. In one example, $Al_{0.3}Ga_{0.7}As$ is used for the oxidation stopping layer 62, and is made to grow to have a film thickness of 64 nm (λ/4). In one example, $Al_{0.9}Ga_{0.1}As$ is used for the rough surface formation layer 60, and is made to grow to have a film thickness of 191 nm (3λ/4).

Next, the active region 24 that is formed of a lower spacer made of a non-doped $Al_{0.6}Ga_{0.4}As$ layer, a non-doped quantum well active layer, and an upper spacer layer made of a non-doped $Al_{0.6}Ga_{0.4}As$ layer is formed on the rough surface formation layer 60. The quantum well layer is formed of four barrier layers made of $Al_{0.3}Ga_{0.7}As$ layers and three quantum well layers made of $Al_{0.11}Ga_{0.89}As$ provided between the respective barrier layers. At this time, the film thickness of each barrier layer made of $Al_{0.3}Ga_{0.7}As$ is set to about 5 nm, the film thickness of each quantum well layer made of $Al_{0.11}Ga_{0.89}As$ is set to about 9 nm, and the film thickness of the entire active region 24 is set to the wavelength λ in the medium.

Then, the p-type upper DBR 26 is formed by forming the p-type AlAs layer 50 on the upper spacer layer and alternately laminating, in 20 to 30 cycles, an $Al_{0.3}Ga_{0.7}As$ layer and an $Al_{0.9}Ga_{0.1}As$ layer with a film thickness of ¼ of the wavelength λ in the medium on the AlAs layer 50. At this time, the carrier concentration of the $Al_{0.3}Ga_{0.7}As$ layer and the carrier concentration of the $Al_{0.9}Ga_{0.1}As$ layer are set to about $2\times10^{18}$ cm$^{-3}$, and the total film thickness of the upper DBR 26 is set to about 3 μm. In one example, the p-type carrier is C (carbon). The p-type GaAs contact layer 28 with carrier concentration of about $1\times10^{19}$ cm$^{-3}$ and a film thickness of about 10 nm is formed on the upper DBR 26.

Next, description will be given of a method of manufacturing the VCSEL element 10 according to the exemplary embodiment after the epitaxial growth.

Figure 2B:
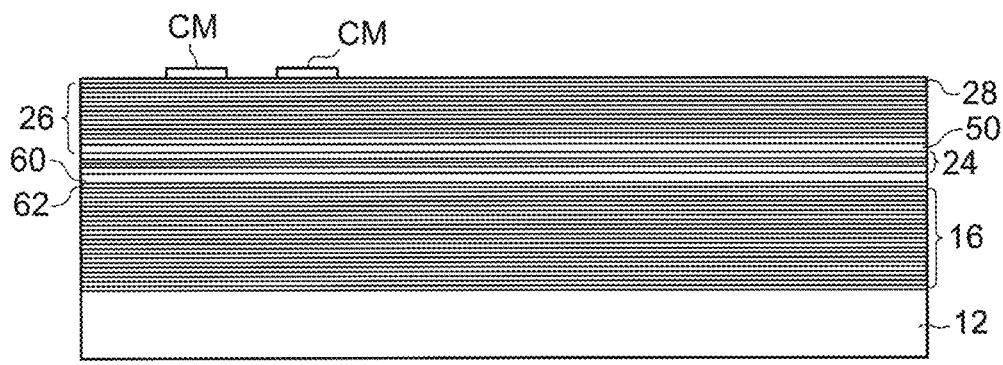

First, a film of an electrode material is formed on the contact layer 28 of the wafer after completion of the epitaxial growth, the material is then etched by using a mask of photolithography, for example, and contact metal (CM) for extracting the P-type electrode 36 is formed as illustrated in FIG. 2B. The contact metal CM is formed by using a Ti/Au laminated film in one example.

Figure 2C:
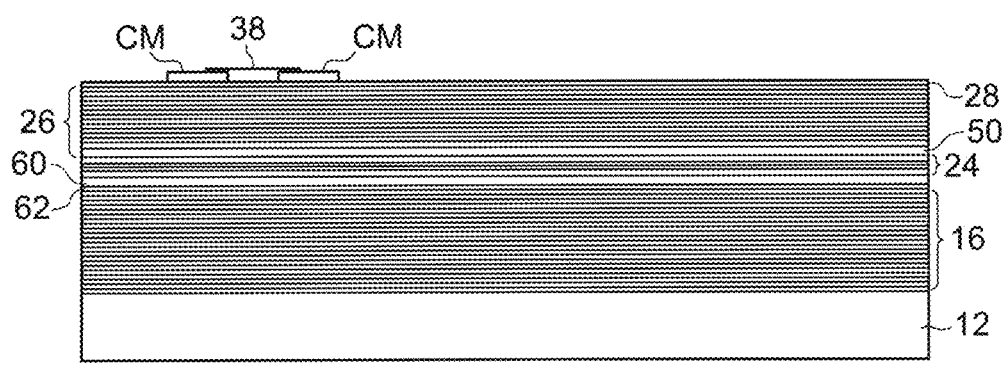

Next, a film of a material of the emitting protection film is formed on the wafer surface, the material is then etched by using a mask of photolithography, for example, and the emitting protection film 38 is formed as illustrated in FIG. 2C. As a material of the emitting protection film 38, an SiN film is used in one example.

Figure 3A:
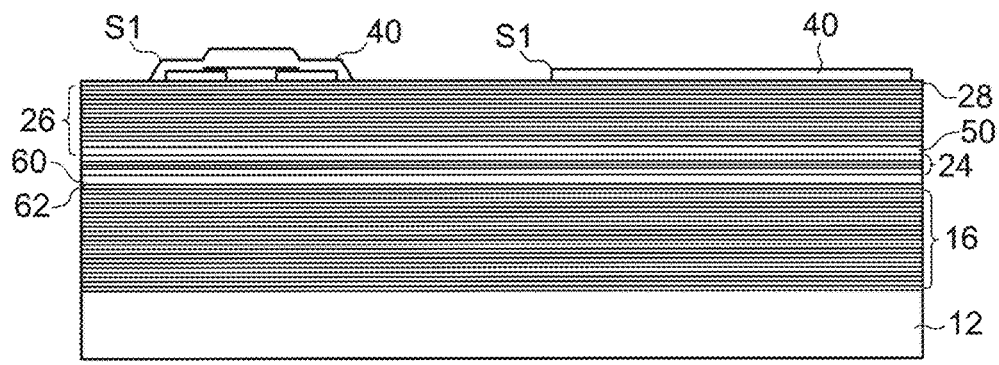
FIGS. 3A to 3C are partial vertical sectional views illustrating an example of a method of manufacturing the surface-emitting semiconductor laser element according to the exemplary embodiment.

Next, a mask material is formed on the wafer surface, the mask material is then etched by photolithography, for example, and the mask 40 for forming the post P is formed as illustrated in FIG. 3A. As a material of the mask 40, SiN is used in one example. A slit S1 for forming the post P by the etching is formed in the mask.

Figure 3B:
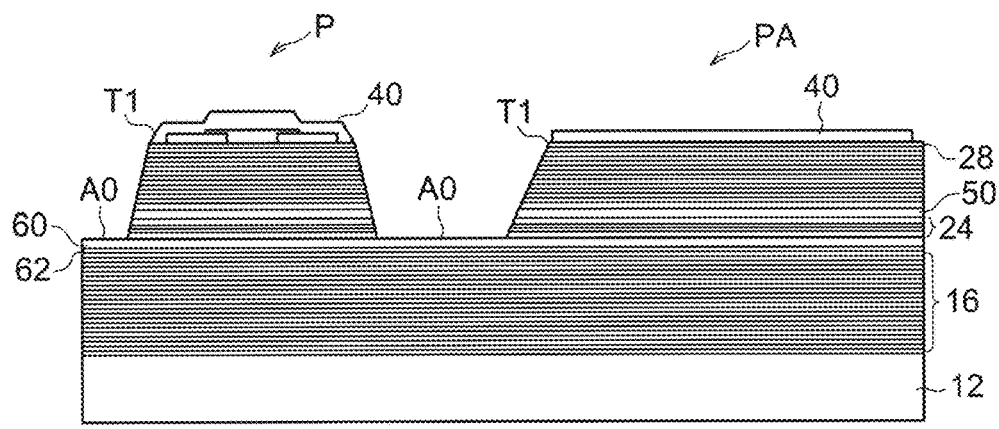

Then, a groove T1 is dug by etching the wafer, and the post P with a mesa shape is formed as illustrated in FIG. 3B. A portion except for the post P separated by the groove T1 corresponds to the pad formation region PA. At this time, the etching bottom surface A0, which is a surface exposed by the etching, is positioned on the rough surface formation layer 60, and a physical film thickness of residual of the rough surface formation layer 60 (a physical film thickness of the rough surface formation layer 60 that remains without being etched) is equal to or greater than 110 nm as will be described later. Here, the "physical film thickness" is a film thickness represented by an actual length, and is a term used with an "optical film thickness", which is a product of the physical film thickness and the refraction index of the medium, as a pair.

Figure 3C:
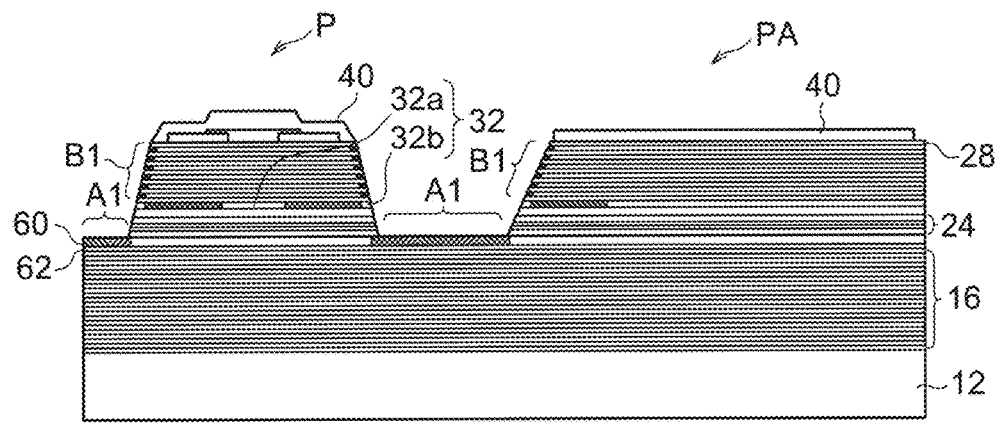

Next, an oxidation treatment is performed on the wafer to oxidize the AlAs layer 50 from the side surface, and the oxidation confining layer 32 is formed in the post P as illustrated in FIG. 3C. The oxidation confining layer 32 includes the current injection region 32a and the selectively oxidized region 32b. The selectively oxidized region 32b corresponds to a region oxidized by the aforementioned oxidation treatment, and a region that remains without being oxidized corresponds to the current injection region 32a. The current injection region 32a has a circular shape or a substantially circular shape, and the current injection region 32a confines a current flowing between the p-type electrode 36 and the n-type electrode 30 of the VCSEL element 10 and controls the transverse mode of the oscillation of the VCSEL element 10, for example.

Here, not only the AlAs layer 50 but also the etching bottom surface A0, the side surface of the post P, and the side surface of the pad formation region PA are also oxidized in the oxidation treatment. The oxidation of the etching bottom surface A0 is oxidation of the rough surface formation layer 60, and an oxidized region A1 is formed by the oxidized region in the rough surface formation layer 60 as illustrated in FIG. 3C. In addition, an oxidized region B1 is formed in the side surface of the post P and the side surface of the pad formation region PA. The oxidized region B1 is formed by oxidizing a layer that is more easily oxidized (the $Al_{0.9}Ga_{0.1}As$ layer in the exemplary embodiment) in the two layers with different refraction indexes, which form the upper DBR 26. Therefore, the oxidized portion appears once in every two layers as illustrated in FIG. 3C.

Figure 4A:
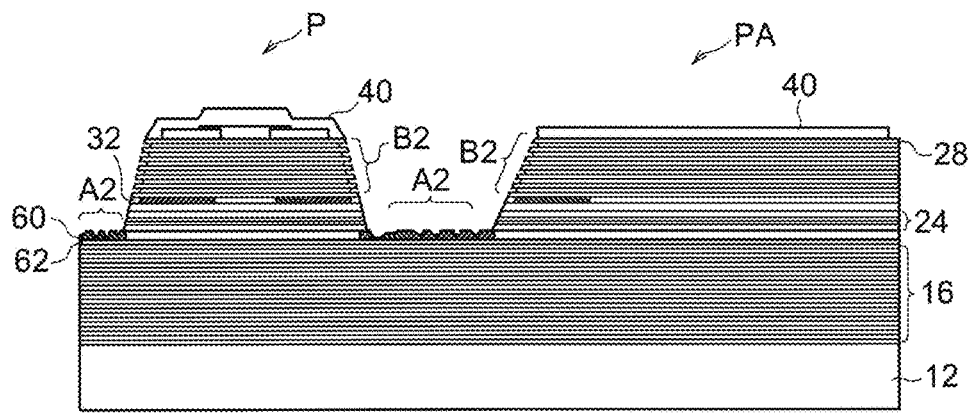
FIGS. 4A to 4C are partial vertical sectional views illustrating an example of a method of manufacturing the surface-emitting semiconductor laser element according to the exemplary embodiment.

Next, buffered fluorine (BHF) treatment as an example of an acid treatment is performed on the entire wafer. As illustrated in FIG. 4A, a rough surface (irregularity) in an order of submicron is formed in the oxidized region A1 of the rough surface formation layer 60 by the BHF treatment, and the oxidized region A1 becomes a rough surface region A2. The rough surface region A2 is formed by randomly removing the surface portion of the oxidized region A1. The oxidized region B1 is also removed at the same time, and a removed region B2 with an irregular shape is formed on the side surface of the post P and the side surface of the pad formation region PA.

Here, BHF is a mixed aqueous solution of ultrapure hydrofluoric acid and an ammonium fluoride solution. A fluorine mixing ratio of the BHF used in the process and BHF treatment time in the process maybe selected within such ranges that oxidation products of the upper DBR 26 other than the oxidation confining layer 32 exposed from the side surface of the post P may be removed and the oxidation products of the oxidation confining layer 32 is not deeply eroded. In a specific example, BHF 1200 or BHF 110 is used as the BHF, and the BHF treatment time is set to be equal to or greater than 60 seconds. BHF 1200 is a buffered fluorine obtained by mixing 50% by weight of hydrofluoric acid and 40% by weight of ammonium fluoride aqueous solution at a ratio of 1:200 (weight ratio), and BHF 110 is buffered fluorine obtained by mixing 50% by weight of hydrofluoric acid and 40% by weight of ammonium fluoride aqueous solution at a ratio of 1:10 (weight ratio). It is a matter of course that the acid treatment in the acid treatment process is not limited to usage of BHF and may be performed by using other acid.

Figure 4B:
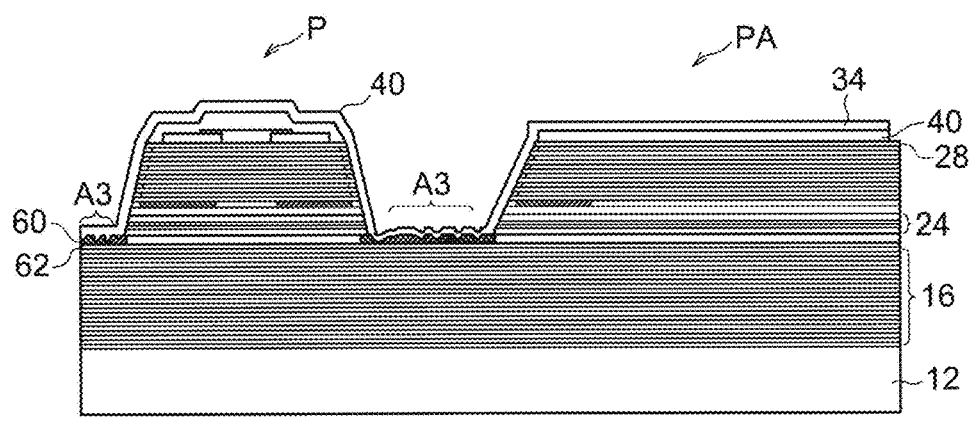

Next, the interlayer insulating film 34 is formed on the entire wafer surface as illustrated in FIG. 4B. By the process, the interlayer insulating film 34 is formed on the rough surface region A2 formed in the rough surface formation layer 60, and a rough surface region A3 including the rough surface formation layer 60 and the interlayer insulating film 34 is formed.

Figure 4C:
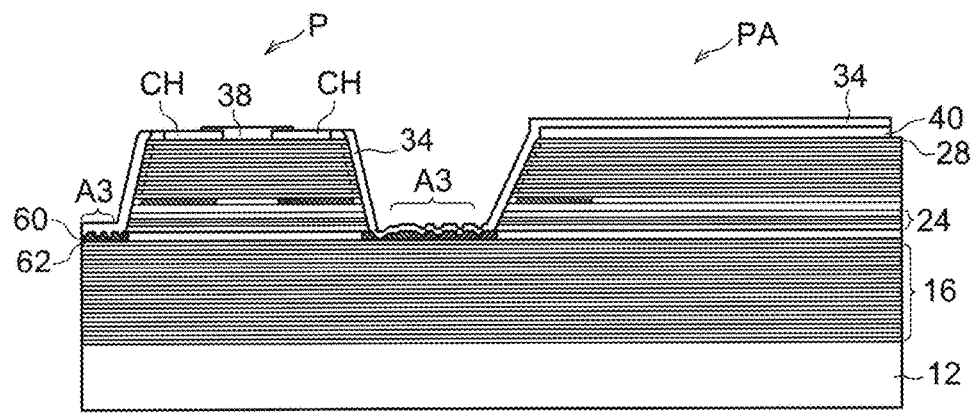

Next, the aforementioned interlayer insulating film 34 is etched by using a mask of photolithography, for example, and a contact hole CH is formed as illustrated in FIG. 4C. The contact hole CH is an opening for connecting the contact metal CM and the p-type electrode 36 which will be described later.

Figure 5A:
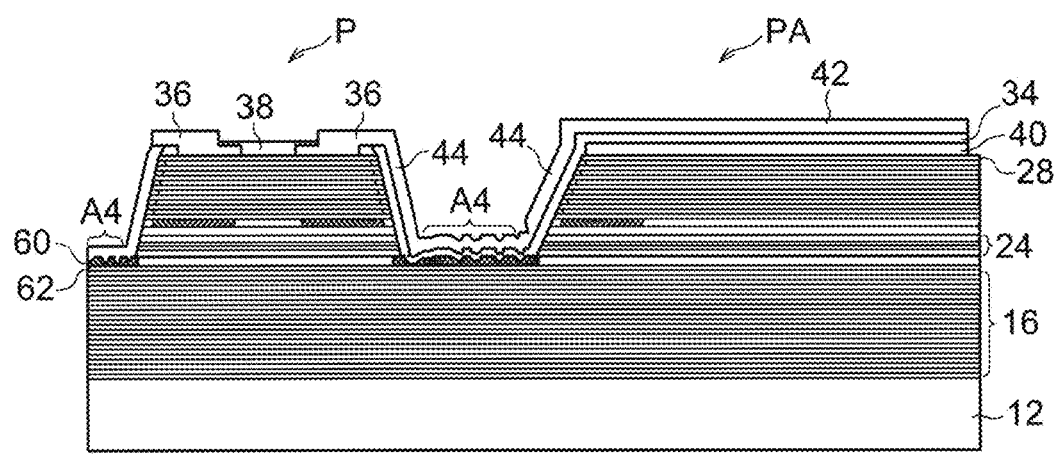
FIGS. 5A and 5B are partial vertical sectional views illustrating an example of a method of manufacturing the surface-emitting semiconductor laser element according to the exemplary embodiment.

Next, a film of an electrode material is formed on the wafer surface, the electrode material is then etched by using a mask of photolithography, for example, and the p-type electrode 36 and the electrode pad 42 are formed as illustrated in FIG. 5A. The p-type electrode 36 and the electrode pad 42 are connected to each other with the electrode wiring 44 passing through the side surface of the post P and the side surface of the pad formation region PA. The p-type electrode 36, the electrode pad 42, and the electrode wiring 44 are formed by using a Ti/Au laminated film in one example. The p-type electrode 36 is connected to the aforementioned contact metal CM by the process. In the process, the electrode wiring 44 is formed on the rough surface region A3, and a rough surface region A4 including the rough surface formation layer 60, the interlayer insulating film 34, and the electrode wiring 44 is formed.

Figure 5B:
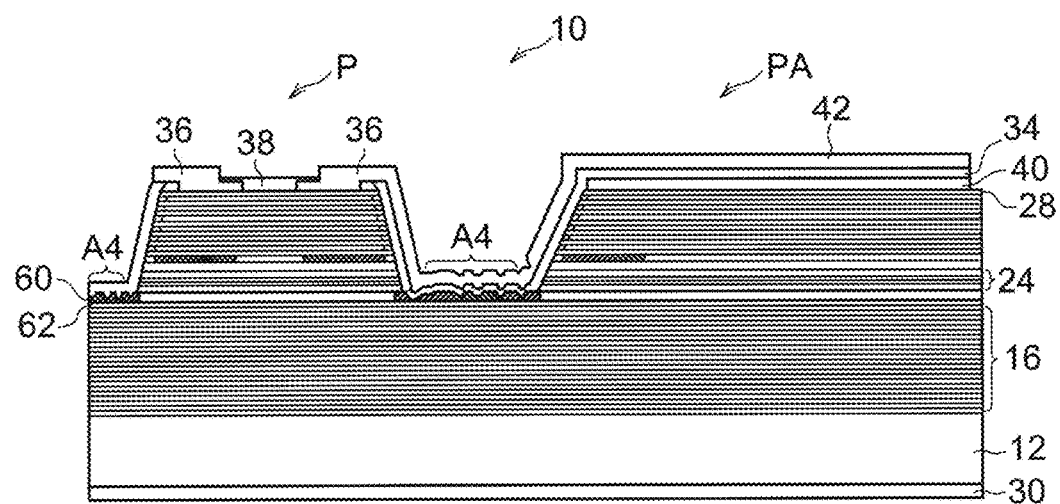

Next, a film of an electrode material is formed on the back surface of the wafer, and the n-type electrode 30 is formed as illustrated in FIG. 5B. The n-type electrode 30 is formed by depositing an AuGe/Au laminated film in one example.

Next, a dicing region which is not shown in the drawing is diced to separate the VCSEL element 10 into a piece. The VCSEL element 10 is manufactured by the above processes.

EXAMPLES

Next, more detailed description will be given of the rough surface formation layer and the rough surface region based on an example of the method of manufacturing the VCSEL element according to the exemplary embodiment with reference to FIGS. 6A to 9B.

Figure 6A:
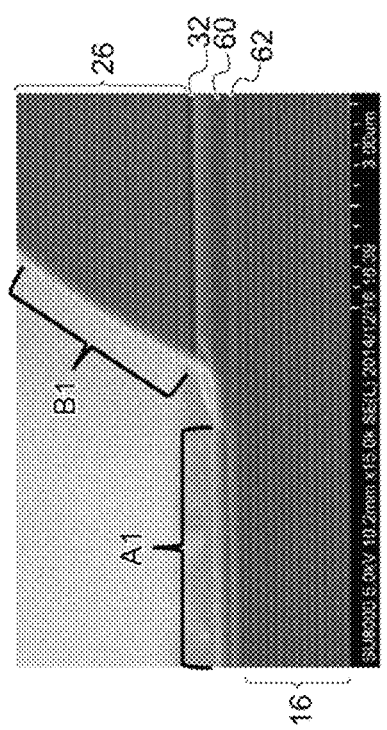
FIGS. 6A to 6C are diagrams illustrating a rough surface region formation process in the method of manufacturing the surface-emitting semiconductor laser element according to the exemplary embodiment.
Figure 6B:
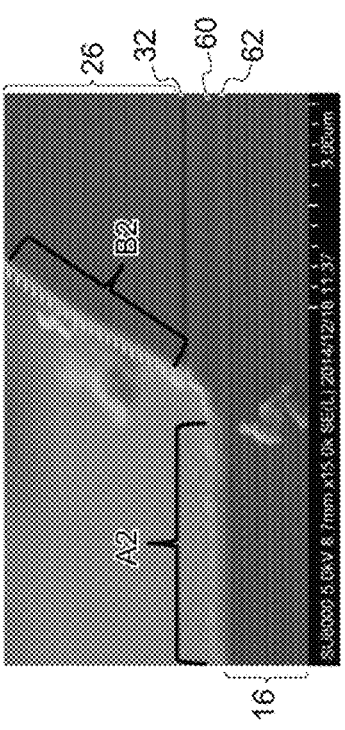
Figure 6C:
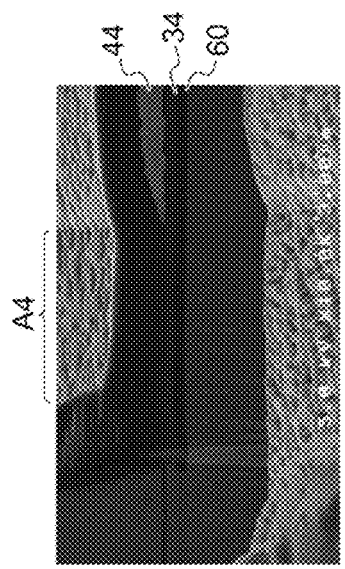

FIG. 6A is a photograph showing a state of FIG. 3C in the aforementioned manufacturing method and shows the oxidized regions A1 and B1 after the oxidation process. FIG. 6B is a photograph showing a state of FIG. 4A in the aforementioned manufacturing method, and shows the rough surface region A2 and the removed region B2 after the acid treatment. FIG. 6C is a photograph showing a state of FIG. 5A in the aforementioned manufacturing method and showing a state in which the interlayer insulating film 34 and the electrode wiring 44 are formed and the rough surface region A4 is formed.

As shown in FIG. 6A, the rough surface formation layer 60 exposed as the etching bottom surface A0 is oxidized from the surface to form the oxidized region A1, and the oxidation is stopped by the oxidation stopping layer 62. The oxidized region B1 is also formed in the side surface of the upper DBR 26 by the oxidation process.

As illustrated in FIG. 6B, the rough surface (irregularity) is formed on the surface of the oxidizer region A1 by the acid treatment, and the oxidized region A1 is changed into the rough surface region A2. The oxidized region B1 on the side surface of the upper DBR 26 is also removed by the acid treatment, and the removed region B2 is formed. In the exemplary embodiment, the BHF 1200 is used for the acid treatment, and the treatment time is set to 60 seconds. In the method of manufacturing the VCSEL element according to the exemplary embodiment, the acid treatment process for forming the rough surface region A2 and the acid treatment process for forming the removed region B2 are performed in a single acid treatment process. However, the exemplary embodiment is not limited thereto, and the acid treatment process for forming the rough surface region A2 and the acid treatment process for forming the removed region B2 may be performed as separate acid treatment processes. The removed region B2 is intentionally performed (the oxidized region B1 is removed) for the purpose of enhancing reliability in some cases.

As illustrated in FIG. 6C, the formation of the interlayer insulating film 34 on the rough surface region A2 in the rough surface formation layer 60 increases a contact surface area between the rough surface formation layer 60 and the interlayer insulating film 34 as compared with a case where the rough surface region A2 is not provided. Therefore, adhesiveness between the rough surface formation layer 60 and the interlayer insulating film 34 is enhanced.

Figure 7A:
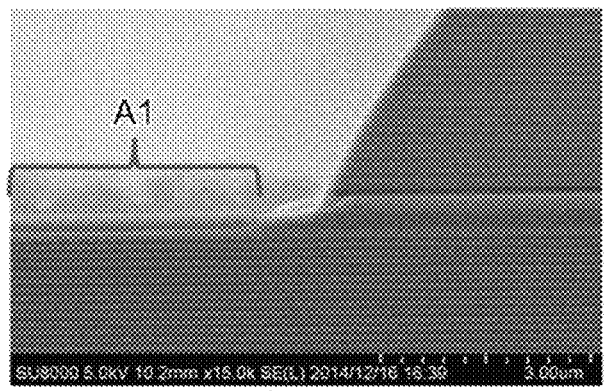
FIGS. 7A to 7C are explanatory diagrams of a relationship between BHF treatment and a state of a rough surface in the method of manufacturing the surface-emitting semiconductor laser element according to the exemplary embodiment.

Next, description will be given of conditions of the acid treatment according to the exemplary embodiment with reference to FIGS. 7A to 7C. FIG. 7A is a diagram illustrating a state of the oxidized region A1 and the circumference thereof before the acid treatment after the oxidation treatment, FIG. 7B is a diagram illustrating a state of a coarse region A2-1 and the circumference thereof after performing the acid treatment with BHF1200 for 60 seconds, and FIG. 7C is a diagram illustrating a state of a rough surface region A2-2 and the circumference thereof after performing the treatment with BHF1200 for 180 seconds.

Figure 7B:
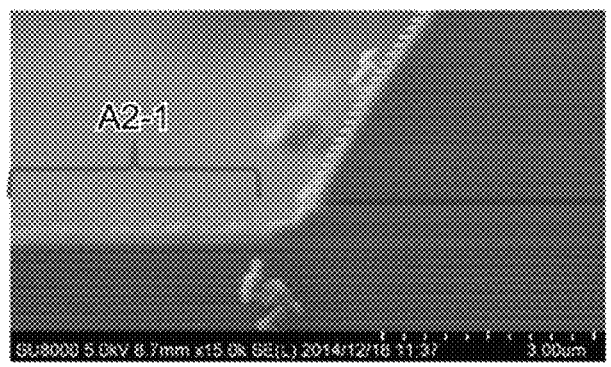
Figure 7C:
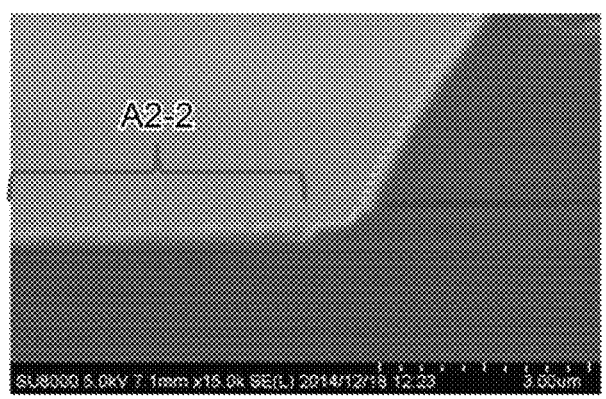

As illustrated in FIGS. 7A to 7C, a satisfactory rough surface is formed by performing the acid treatment with BHF1200 on the oxidized region A1. As is obvious from comparison between the rough surface region A2-1 in FIG. 7B and the rough surface region A2-2 in FIG. 7C, there is no large change between the states of the formed rough surface in the case where the treatment with BHF1200 is performed for 60 seconds and the case where the treatment with BHF1200 is performed for 180 seconds. Therefore, it is possible to recognize that the time of the acid treatment with BHF1200 maybe set to 60 seconds at a minimum and there is no large change in the shape of the rough surface even if the processing time is further extended. The result coincides with a result in FIG. 8, which will be described later.

As for the concentration of BHF, there is a possibility that the oxidation confining layer 32 is deeply eroded in the lateral direction from the side surface of the post P, for example, the diameter of the current injection region 32a deviates from a designed value, and erosion of the semiconductor layer which has not yet been oxidized causes secondary trouble if the concentration of fluorine is increased. Therefore, BHF1200 is preferably used in consideration of the concentration of fluorine.

Figure 8:
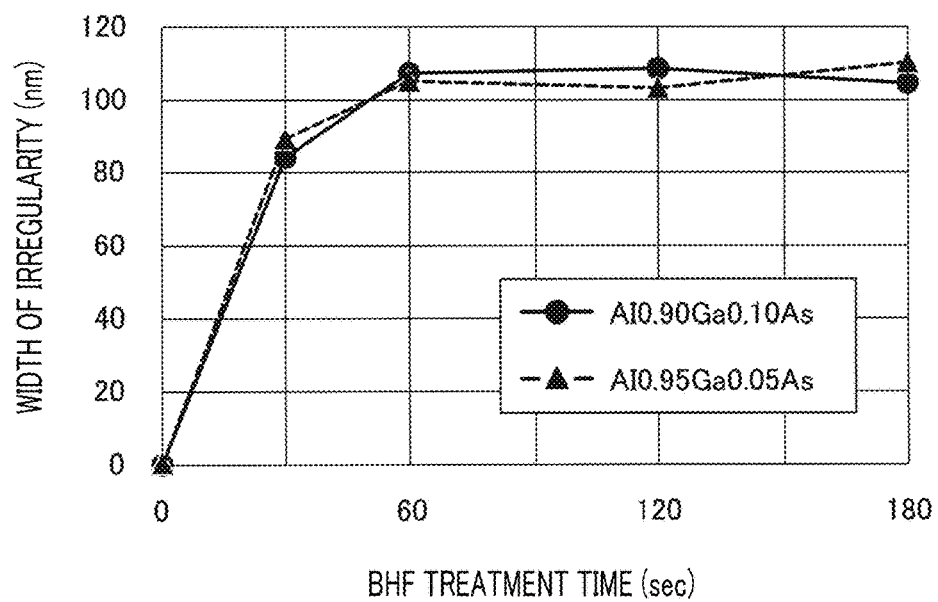
FIG. 8 is a graph illustrating a relationship between BHF treatment time and a width of irregularity on the rough surface layer in the method of manufacturing the surface-emitting semiconductor laser element according to the exemplary embodiment.

Next, description will be given of a relationship between an Al composition ratio in the rough surface formation layer 60 and the degree of irregularity in the region where the rough surface is formed with reference to FIGS. 8 to 9B. FIG. 8 illustrates a relationship between the time of the treatment with BHF1200 (hereinafter, "BHF treatment") and an irregularity width (a difference between an average value of peaks of convexities sampled in the coarse region A2 and an average value of peaks of sampled concavities) in cases where the rough surface formation layer 60 is made of $Al_{0.90}Ga_{0.10}As$ and $Al_{0.95}Ga_{0.05}As$.

As illustrated in FIG. 8, it is possible to recognize that the width of the irregularity is saturated when the width is about 110 nm both in the cases where the Al composition is 90% and 95% and there is no large difference between $Al_{0.90}Ga_{0.10}As$ and $Al_{0.95}Ga_{0.05}As$ in relation to the formation of the irregularity including variation widths with respect to the time of the treatment with BHF1200. In addition, it is possible to recognize that the film thickness of the rough surface formation layer 60 maybe set to at least 110 nm (equal to or greater than 110 nm) since it is only necessary for the film thickness to be equal to or greater than the width of the irregularity formed on the rough surface formation layer 60.

In contrast, it is more preferable to set the film thickness to be equal to or greater than 190 nm (110 nm+40 nm×2) since it is known that variations in the etching depth in the wafer surface is about ±40 nm. However, the AlGaAs layer expands, causes stress, deforms the adjacent semiconductor layer, and deteriorates reliability when oxidized in some cases. Therefore, the film thickness of the rough surface formation layer 60 is preferably set to be equal to or less than 500 nm that is such an upper limit of the film thickness that an influence of the generated stress may be ignored. In short, the film thickness of the rough surface formation layer 60 is preferably from 110 nm to 500 nm, and more preferably from 190 nm to 500 nm.

It is necessary for the Al composition ratio in the rough surface formation layer 60 to be set such that the oxidation depth in the oxidation process is at least equal to or greater than the width of the irregularity formed, and based on the aforementioned result, it is only necessary to set the Al composition ratio necessary for oxidizing the rough surface formation layer 60 by 110 nm or more. Although it is possible to recognize from FIG. 8 that a specific value of the Al composition ratio may be equal to or greater than 90% in one example, the value is not limited thereto and may be less than 90% in consideration of a targeted thickness or the like of the oxidized region A1. However, the Al composition ratio in the rough surface formation layer 60 is preferably set to be lower than the Al composition ratio in the oxidation confining layer 32. This is because controllability of the diameter of the current injection region 32a deteriorates if the oxidation of the rough surface formation layer 60 advances faster than the oxidation of the oxidation confining layer 32, which is unfavorable.

In contrast, the time necessary for the width of the irregularity to reach the saturated value 110 nm is about 60 seconds both for $Al_{0.90}Ga_{0.10}As$ and $Al_{0.95}Ga_{0.05}As$ as in FIG. 8. This result coincides with the aforementioned result in FIGS. 7A to 7C.

Figure 9A:
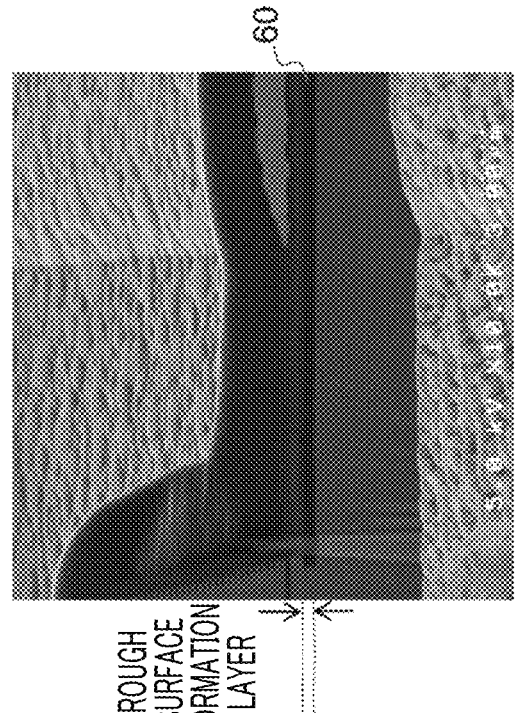
FIGS. 9A and 9B are explanatory diagrams of a relationship between an Al composition and formation of the rough surface region in the method of manufacturing the surface-emitting semiconductor laser element according to the exemplary embodiment.
Figure 9B:
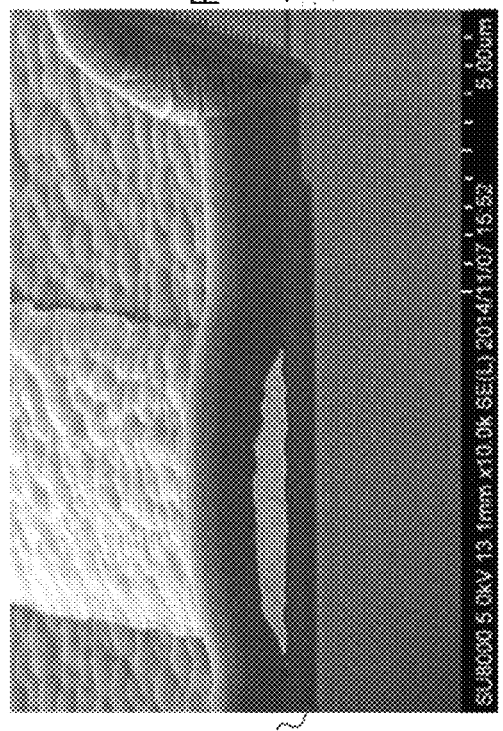

In relation to FIGS. 9A and 9B, FIGS. 9A is a photograph of the rough surface formation layer 60 in the case where the Al composition is set to 90%, and FIG. 9B is a photograph of the rough surface formation layer 60 in the case where the Al composition is set to 95%. As shown in FIGS. 9A and 9B, it is possible to recognize that the rough surfaces (irregularities) are satisfactorily formed in both the cases where the Al composition is 90% and 95%. The acid treatment in FIGS. 9A and 9B is performed for 60 seconds by using BHF1200.

Here, the reason that the rough surface (irregularity) is formed on the rough surface formation layer 60 by the rough surface formation process (an oxidation process and an acid treatment process) in the method of manufacturing the VCSEL element according to the exemplary embodiment is as follows. That is, Al oxidation products and As oxidation products are present together in the oxidized rough surface formation layer, the Al oxidation products are localized on the surface side, and the rate of the As oxidation products increases toward the deeper side. In addition, the etching rate in the acid treatment is higher for the Al oxidation products than for the As oxidation products. Therefore, the etching is stopped at a specific depth (110 nm in FIG. 8), the Al oxidation products are removed, and the As oxidation products remain. In doing so, the irregularity is formed.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A method of manufacturing a surface-emitting semiconductor laser element comprising:
   a first process of forming, on a substrate, a semiconductor layer that includes a first semiconductor multilayer reflection mirror of a first conductivity type, a rough surface formation layer on the first semiconductor multilayer reflection mirror, an active region on the rough surface formation layer, a second semiconductor multilayer reflection mirror of a second conductivity type on the active region, and a current confining layer that is adjacent to the active region;
   a second process of forming a mesa structure of the semiconductor layer by etching the semiconductor layer until the rough surface formation layer is exposed;
   a third process of oxidizing a region including the current confining layer and the rough surface formation layer exposed to the circumference of the mesa structure;
   a fourth process of forming a rough surface region by performing an acid treatment on a region including the oxidized rough surface formation layer; and
   a fifth process of forming an insulating film on the region including the rough surface region.

2. The method of manufacturing a surface-emitting semiconductor laser element according to claim 1,
   wherein, in the forming the rough surface formation layer in the first process, an $Al_xGa_{1-x}As$ ($0<x<1$) layer with a film thickness from 110 nm to 500 nm is formed.

3. The method of manufacturing a surface-emitting semiconductor laser element according to claim 2,
   wherein a value of x of the $Al_xGa_{1-x}As$ ($0<x<1$) layer is such a value that is sufficient to oxidize the rough surface formation layer by a depth of equal to or greater than 110 nm from the surface in the third process.

4. The method of manufacturing a surface-emitting semiconductor laser element according to claim 2,
   wherein the value of x of the $Al_xGa_{1-x}As$ ($0<x<1$) layer is equal to or greater than 0.9.

5. The method of manufacturing a surface-emitting semiconductor laser element according to claim 3,
   wherein the value of x of the $Al_xGa_{1-x}As$ ($0<x<1$) layer is equal to or greater than 0.9.

6. The method of manufacturing a surface-emitting semiconductor laser element according to claim 2,
   wherein, in the forming the current confining layer in the first process, an $Al_yGa_{1-y}As$ ($0<y\leq1$, $y>x$) layer is formed.

7. The method of manufacturing a surface-emitting semiconductor laser element according to claim 3,
   wherein, in the forming the current confining layer in the first process, an $Al_yGa_{1-y}As$ ($0<y\leq1$, $y>x$) layer is formed.

8. The method of manufacturing a surface-emitting semiconductor laser element according to claim 4,
   wherein, in the forming the current confining layer in the first process, an $Al_yGa_{1-y}As$ ($0<y\leq1$, $y>x$) layer is formed.

9. The method of manufacturing a surface-emitting semiconductor laser element according to claim 1,
   wherein, in the first process, the semiconductor layer that further includes, immediately below the rough surface formation layer, an oxidation stopping layer that stops the oxidation of the rough surface formation layer is formed in the third process.

10. The method of manufacturing a surface-emitting semiconductor laser element according to claim 2,
    wherein, in the first process, the semiconductor layer that further includes, immediately below the rough surface formation layer, an oxidation stopping layer that stops the oxidation of the rough surface formation layer is formed in the third process.

11. The method of manufacturing a surface-emitting semiconductor laser element according to claim 3,
    wherein, in the first process, the semiconductor layer that further includes, immediately below the rough surface formation layer, an oxidation stopping layer that stops the oxidation of the rough surface formation layer is formed in the third process.

12. The method of manufacturing a surface-emitting semiconductor laser element according to claim 4,
    wherein, in the first process, the semiconductor layer that further includes, immediately below the rough surface formation layer, an oxidation stopping layer that stops the oxidation of the rough surface formation layer is formed in the third process.

13. The method of manufacturing a surface-emitting semiconductor laser element according to claim 5,
    wherein, in the first process, the semiconductor layer that further includes, immediately below the rough surface formation layer, an oxidation stopping layer that stops the oxidation of the rough surface formation layer is formed in the third process.

14. The method of manufacturing a surface-emitting semiconductor laser element according to claim 9,
    wherein when $\lambda$ represents an oscillation wavelength in a medium of the surface-emitting semiconductor laser element,
    in forming the first semiconductor multilayer reflection mirror and the second semiconductor multilayer reflection mirror in the first process, two layers with mutually different refraction indexes and with a film thickness of $\lambda/4$ are alternately laminated, and
    in forming the rough surface formation layer and the oxidation stopping layer, each layer is formed such that each film thickness or a total film thickness is an integral multiple of $\lambda/4$.

15. The method of manufacturing a surface-emitting semiconductor laser element according to claim 10,
    wherein when $\lambda$ represents an oscillation wavelength in a medium of the surface-emitting semiconductor laser element,
    in forming the first semiconductor multilayer reflection mirror and the second semiconductor multilayer reflection mirror in the first process, two layers with mutually different refraction indexes and with a film thickness of $\lambda/4$ are alternately laminated, and
    in forming the rough surface formation layer and the oxidation stopping layer, each layer is formed such that each film thickness or a total film thickness is an integral multiple of $\lambda/4$.

16. The method of manufacturing a surface-emitting semiconductor laser element according to claim 11,
    wherein when $\lambda$ represents an oscillation wavelength in a medium of the surface-emitting semiconductor laser element,
    in forming the first semiconductor multilayer reflection mirror and the second semiconductor multilayer reflection mirror in the first process, two layers with mutually different refraction indexes and with a film thickness of $\lambda/4$ are alternately laminated, and in forming the rough surface formation layer and the oxidation stopping layer, each layer is formed such that each film thickness or a total film thickness is an integral multiple of λ/4.

17. The method of manufacturing a surface-emitting semiconductor laser element according to claim 12,
wherein when λ represents an oscillation wavelength in a medium of the surface-emitting semiconductor laser element,
in forming the first semiconductor multilayer reflection mirror and the second semiconductor multilayer reflection mirror in the first process, two layers with mutually different refraction indexes and with a film thickness of λ/4 are alternately laminated, and
in forming the rough surface formation layer and the oxidation stopping layer, each layer is formed such that each film thickness or a total film thickness is an integral multiple of λ/4.

18. The method of manufacturing a surface-emitting semiconductor laser element according to claim 13,
wherein when λ represents an oscillation wavelength in a medium of the surface-emitting semiconductor laser element,
in forming the first semiconductor multilayer reflection mirror and the second semiconductor multilayer reflection mirror in the first process, two layers with mutually different refraction indexes and with a film thickness of λ/4 are alternately laminated, and
in forming the rough surface formation layer and the oxidation stopping layer, each layer is formed such that each film thickness or a total film thickness is an integral multiple of λ/4.

19. The method of manufacturing a surface-emitting semiconductor laser element according to claim 1,
wherein, in the fourth process, an oxidized region in a side surface of the mesa structure formed in the third process is removed.

20. The method of manufacturing a surface-emitting semiconductor laser element according to claim 2,
wherein, in the fourth process, an oxidized region in a side surface of the mesa structure formed in the third process is removed.

* * * * *